(12) United States Patent
Konshak

(10) Patent No.: US 6,946,598 B1
(45) Date of Patent: Sep. 20, 2005

(54) SNAP-IN SLOT MOUNT RFI/EMI CLIPS

(75) Inventor: Michael Vaughn Konshak, Louisville, CO (US)

(73) Assignee: Storage Technology Corporation, Louisville, CO (US)

( * ) Notice: Subject to any disclaimer, the term of this patent is extended or adjusted under 35 U.S.C. 154(b) by 4 days.

(21) Appl. No.: 10/785,603

(22) Filed: Feb. 24, 2004

Related U.S. Application Data

(60) Provisional application No. 60/449,946, filed on Feb. 25, 2003.

(51) Int. Cl.$^7$ ............................................. H05K 9/00
(52) U.S. Cl. ................. 174/35 GC; 361/800
(58) Field of Search ............ 174/35 GC; 277/920; 361/799, 800

(56) References Cited

U.S. PATENT DOCUMENTS 2,825,042 A * 2/1958 Tollefson et al. ........... 439/607

6,323,419 B1 * 11/2001 Toy ....................... 174/35 GC

\* cited by examiner

Primary Examiner—Hung V. Ngo
(74) Attorney, Agent, or Firm—Yee & Associates, P.C.

(57) ABSTRACT

An EMI shielding gasket for reducing the amount of force required during the mounting process. The present invention provides an extended lip feature on the gasket to facilitate the installation process and to function as a lead-in, such that less force is required by the assembler when mounting the EMI gasket. As less manipulation may be required to install the gaskets, gaskets may be mounted correctly more often, thereby preventing the occurrence of EMI leakage. The present invention also reduces the possibility that the EMI gaskets may become damaged due to excess manipulation, and assemblers may experience fewer physical problems related to manipulating the gaskets. By reducing the amount of force required to mount the EMI gaskets, the present invention may increase productivity by decreasing assembly time, decrease rework of improperly assembled or damaged gaskets, and reduce health risks and subsequent insurance claims of assemblers during manufacturing.

10 Claims, 3 Drawing Sheets

SNAP-IN SLOT MOUNT RFI/EMI CLIPS

CROSS REFERENCE TO RELATED APPLICATIONS

This application claims the benefit of the filing date of corresponding U.S. Provisional Patent Application No. 60/449,946, entitled SNAP-IN SLOT MOUNT RFI/EMI CLIPS, filed Feb. 25, 2003.

BACKGROUND OF THE INVENTION

1. Field of the Invention

The present invention relates generally to an electromagnetic interference (EMI)/radio frequency (RF) interference shielding gasket for use in suppressing undesired electromagnetic emissions. In particular, the present invention relates to an improved shielding gasket for reducing the amount of force required during the mounting process.

2. Background of the Invention

Electromagnetic interference (EMI) refers to an electromagnetic disturbance that may potentially impede or degrade the reception of authorized electronic emissions. Undesirable electromagnetic fields leaked from an electronic device may disrupt the operation of other electronic devices in a localized area. Although the metallic housing of the electronic device acts as a shield to contain electromagnetic signals, electromagnetic emissions may still pass through air gaps in the metallic enclosure seams. For example, enclosure seams, such as doors, panels, and other connected interfaces of a modular enclosure, may contain small gaps between modules. If an air gap exists in the seam, the flow of electromagnetic energy will be diverted to those connected interfaces and pass through the seam.

In order to contain or suppress undesired radiated emissions in modular enclosures, shielding gaskets are typically used to maintain a conductive pathway across enclosure members. For example, FIG. 1 depicts a known system 100 including EMI slot mount gasket 102. EMI gasket 102 comprises a plurality of ribs or clips, such as clips 104 and 106. Clips 104 and 106 act as latching mechanisms, and allow EMI gasket 102 to be mounted on flange 108 in a snap-on manner and hold EMI gasket 102 in place. Flange 108 may be located on a receiving device, such as a chassis member or a modular component. FIG. 1 illustrates how EMI gasket 102 may be mounted in slots of flange 108 and compressed between another chassis member or module 110 to effectively create a conductive pathway between the members.

EMI gaskets in effect seal the air gaps between mating modules or chassis members. With higher data rates exceeding frequencies of 1 gigahertz, the number of shielding gaskets used must be increased to reduce the size of apertures that might leak undesired EMI energy. Consequently, the application and installation of this increased number of shielding gaskets in a manufacturing environment becomes tedious and time consuming. Due to the difficulty in inserting the gaskets in their respective mounting holes or slots, the shielding gaskets may not be mounted correctly in many instances. Furthermore, slot mount gaskets may become damaged because of excess manipulation caused by the handlers in their attempts to position the gaskets by applying pressure to mount the ribs or clips into their respective slots. This excess manipulation may cause physical problems of employee thumbs and fingers, as well as cause failures in testing for radiated emissions if the gaskets are not mounted correctly. Excess handling of the gasket due to re-fitting may have corrosive effects that may deteriorate the conductivity of the material/plating surface over time (e.g., salt from fingertips if gloves are not worn). The corrosive effects may lead to early failure of the gasket joints, as well as causing the gasket to fall out of compliance with applicable agency regulations.

Therefore, it would be advantageous to have an EMI suppression mechanism that includes a lead-in to reduce the amount of force required of the assembler during the mounting process, thereby providing for easier assembly during rework or product upgrades.

SUMMARY OF THE INVENTION

The present invention provides an improved shielding gasket for reducing the amount of force required during the mounting process. The present invention solves the problems present in the prior art by modifying existing EMI gaskets to include an extended lip on the ribs or clips of the gaskets. This extended lip is added to the ribs or clips to facilitate the EMI gasket installation process. The ramp feature is implemented in the present invention to function as a lead-in, such that less force is required by the assembler when mounting the EMI gasket onto a module or chassis member. In this manner, the installation process may be improved, since an assembler may spend less time manipulating the gasket in an attempt to position and mount the clips into their respective slots on the module or chassis.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
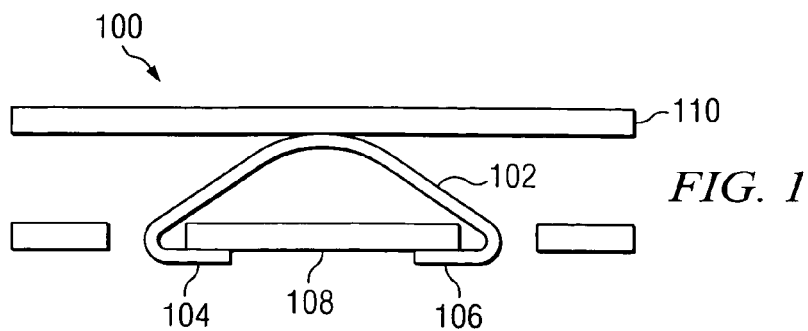
FIG. 1 depicts a known system including a slot mount electromagnetic interference (EMI) gasket.
Figure 2:
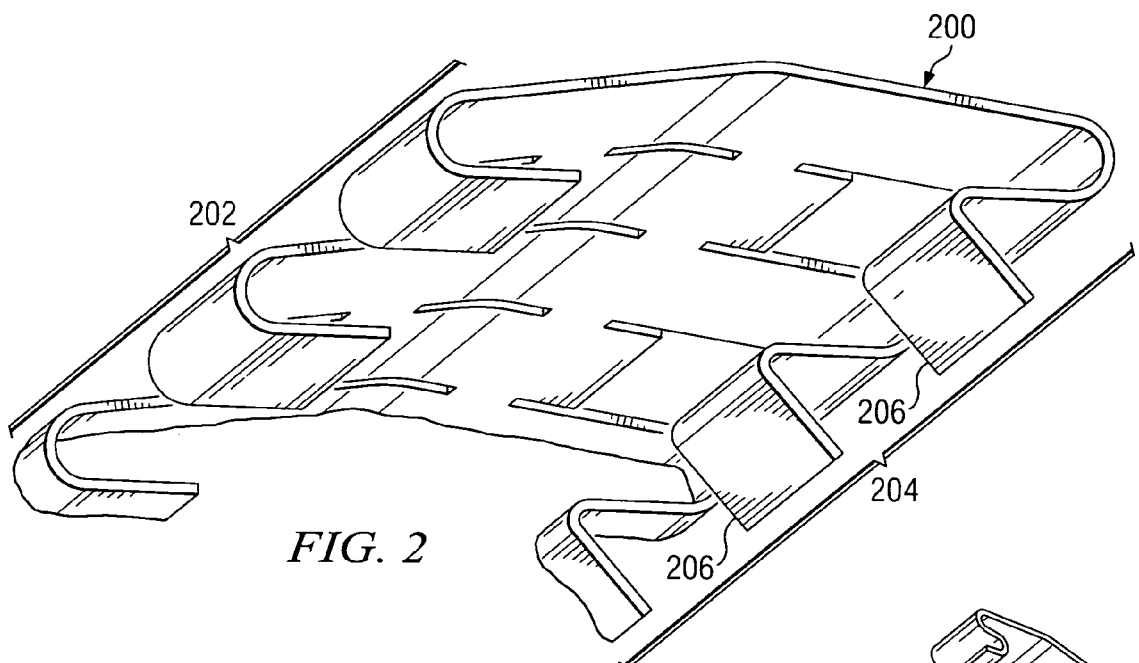
FIG. 2 depicts a bottom view of an exemplary EMI gasket in accordance with a preferred embodiment of the present invention.

Referring now to the figures, FIG. 2 shows a bottom view of an exemplary electromagnetic interference (EMI) gasket in accordance with a preferred embodiment of the present invention. EMI gasket 200 has an arched configuration and may comprise a plurality of first and second ribs or clips, such as first clip row 202 and second clip row 204. Each rib or clip in first clip row 202 corresponds to a rib or clip in second clip row 204. First clip row 202 may be positioned directly opposing second clip row 204. First and second clip rows 202 and 204 extend beyond opposite sides of the main portion of EMI gasket 200 and curve back inward under themselves in a rib-like manner.

Clips are desirable for their ease of installation when there is an accessible mounting flange. EMI gasket 200 may be mounted by first placing a row of ribs or clips, such as first clip row 202, into slots on the receiving device, such as a module or chassis member. Alternatively, in an edge mount system, first clip row 202 may be placed over the edges of the flange. Pressure may then be applied to EMI gasket 200 to snap each clip of second clip row 204 into their respective slots on the receiving device.

In particular, EMI gasket 200 comprises a modified row of ribs or clips in accordance with a preferred embodiment of the present invention. The present invention improves upon known EMI gaskets by modifying the clips to include extended lip 206 at the end of the clips, as shown by modified second clip row 204. The addition of extended lip 206 to form modified second clip row 204 reduces the amount of force required to mount EMI gasket 200.

When EMI gasket 200 is placed over the module or chassis member, a first row of clips, such as first clip row 202, are mounted into slots on the module or chassis. At this point, the second row of clips needs to be installed in their respective slots on the module or chassis member. As pressure is applied to EMI gasket 200 to install the second row of clips, extended lip 206 of second clip row 204 provides a lead-in, such that the force needed to slip each modified clip in second clip row 204 into its respective slot is less than if the clips in second clip row 204 did not include extended lip 206.

Figure 3:
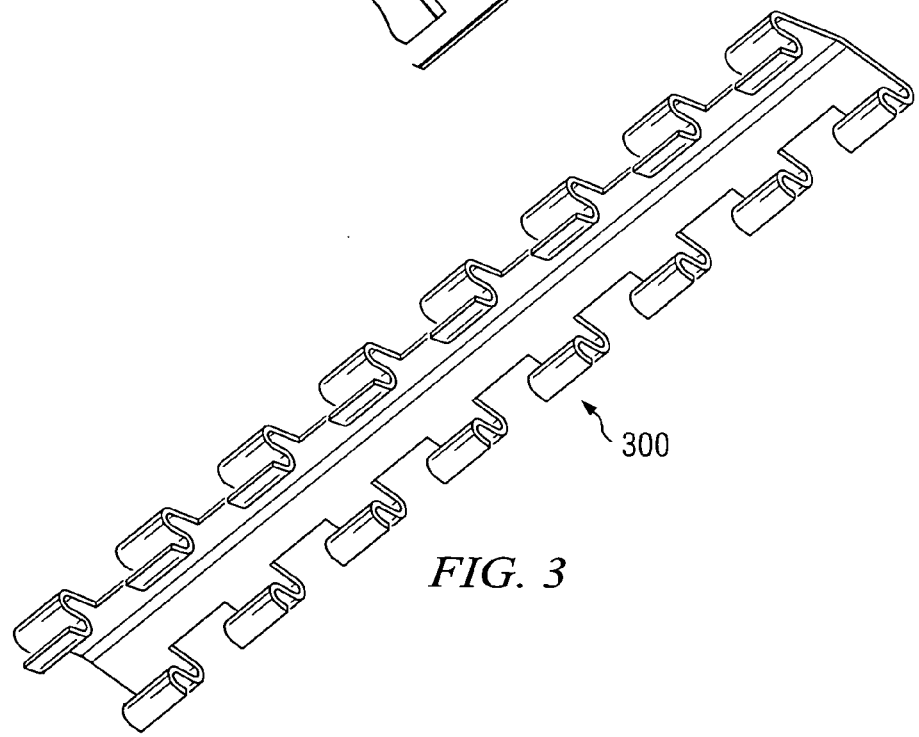
FIG. 3 depicts a bottom view of an exemplary EMI gasket in accordance with an alternative embodiment of the present invention.

Although two different ribs or clips are used for EMI gasket 200 as shown in FIG. 2, one having a known rib or clip structure (i.e., first clip row 202) and the other employing the lip addition of the present invention (i.e., second clip row 204), it should be noted that it is also possible to utilize the lip addition on both rows of ribs or clips, as shown in FIG. 3. FIG. 3 depicts another embodiment of the present invention having the lip addition on both rows of ribs or clips for EMI gasket 300, such that all of the ribs or clips for EMI gasket 300 will include the lip addition to further facilitate the installation of EMI gasket 300 onto a receiving device. FIG. 3 also illustrates that the shape of the lip addition may vary. Thus, one of ordinary skill in the art would understand that the present invention includes, but is not limited to, the lip addition configurations listed above.

Figure 4:
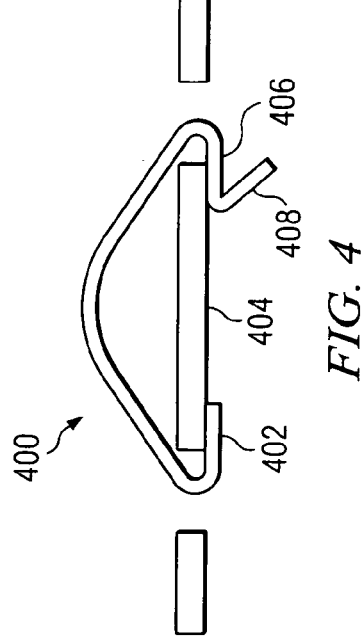
FIG. 4 depicts a side view of an exemplary EMI gasket in accordance with a preferred embodiment of the present invention.

Turning now to FIG. 4, a side view of an exemplary EMI gasket, described in FIG. 2, is depicted in accordance with a preferred embodiment of the present invention. EMI gasket 400 is placed on mounting flange 404 of a receiving device, such as a module or chassis member. When clip 402 is inserted into a slot in flange 404, pressure may be applied to EMI gasket 400 to mount modified clip 406 with extended lip 408 into a second slot of flange 404. In this manner, less force is required to insert each clip into each slot of flange 404. Consequently, the time it takes to install EMI gasket 400 may be reduced, thereby decreasing assembly time and increasing productivity.

Furthermore, the addition of extended lip 408 to the clips may decrease the rework of improperly assembled or damaged gaskets. Installation of these gaskets has become time consuming, since it can be difficult to insert the clips into their respective mounting slots. Due to the difficulty, the gaskets are not mounted properly in some cases. Excess manipulation of the gaskets to properly position the gaskets and mount the clips may also result in damage to the gaskets. Since the lip additions to the clips allow an assembler to use less force to insert the clips into their respective slot, an assembler may more easily install a gasket onto a receiving device. By providing a mechanism that allows an assembler to more easily install the gasket, the gaskets are more likely to be installed correctly since the difficulty of inserting the clips into their respective slots is decreased. As a result, the need to rework improperly assembled or damaged gaskets is reduced.

In addition, the impact on the physical health of the assembler during manufacturing may also be lessened. By providing a mechanism that allows an assembler to more easily install the gasket, the toll on the fingers and thumbs of the assembler may be decreased. Thus, the present invention allows for reduce health problems and subsequent insurance claims of assemblers during the manufacturing process.

Figure 5:
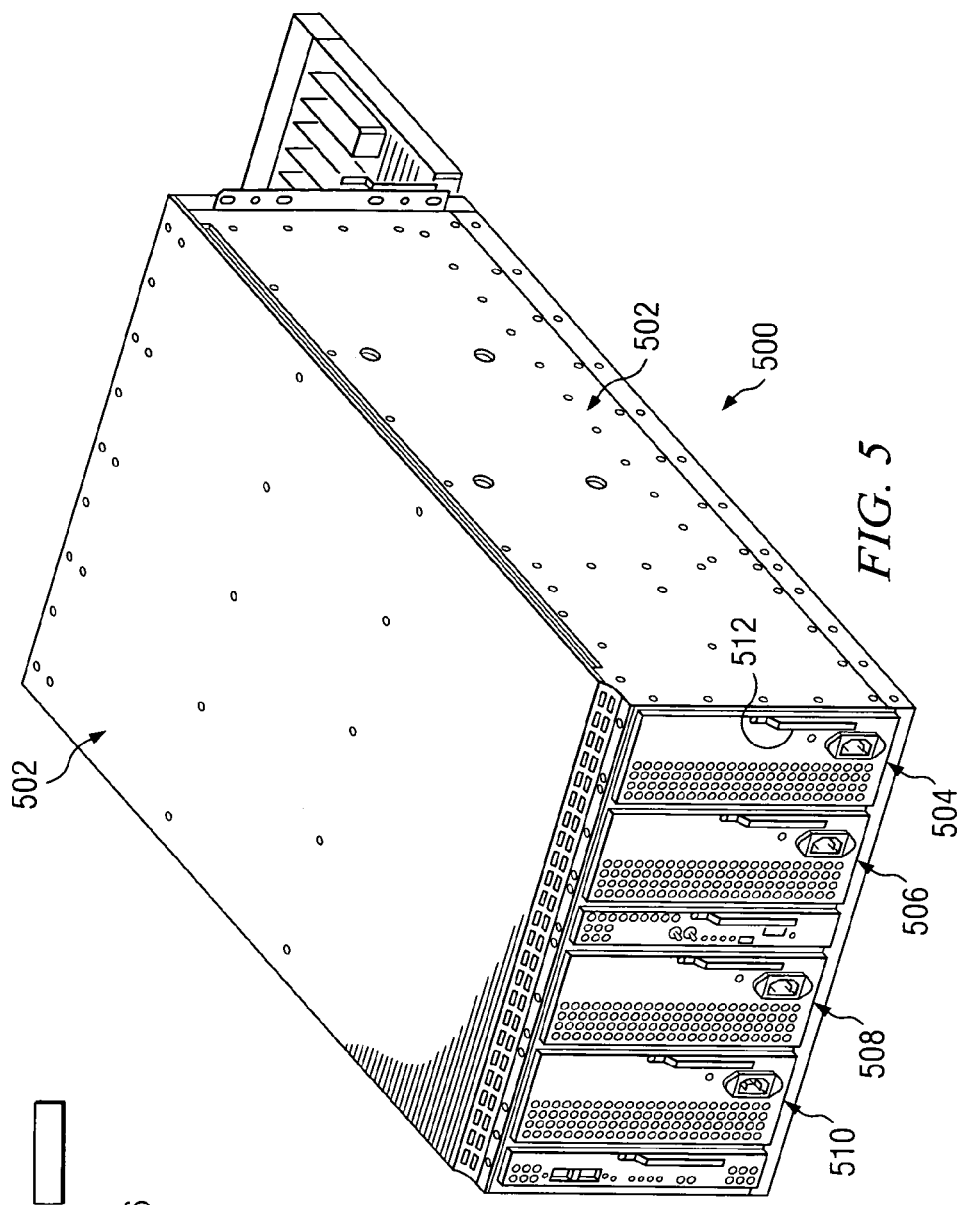
FIG. 5 depicts a pictorial diagram of an example application of EMI gaskets, described in FIGS. 2, 3, and 4, utilizing a storage array.

Turning now to FIG. 5, a pictorial diagram of an example application of EMI gaskets, described in FIGS. 2, 3, and 4, is depicted utilizing a storage array. Storage array 500 comprises several drive bays which are mounted in frame 502 and located at one end of storage array 500. The drive bays are used to mount disk array modules, such as disk array modules 504, 506, 508, and 510, each of which contains a plurality of high-density disks. Other items may also be included within storage array 500, such as a power supply, fan assembly, high performance engine and microprocessor. Frame 502 may be any general support structure for mounting the components of the storage array in an operative relationship.

Storage array controller electronics may be mounted into frame 502 to provide intelligence to storage array 500. A disk array module, such as disk array module 504, may be inserted into a drive bay, and removed from the drive bay by using an ejection mechanism, such as eject lever 512 on disk array module 504.

Figure 6:
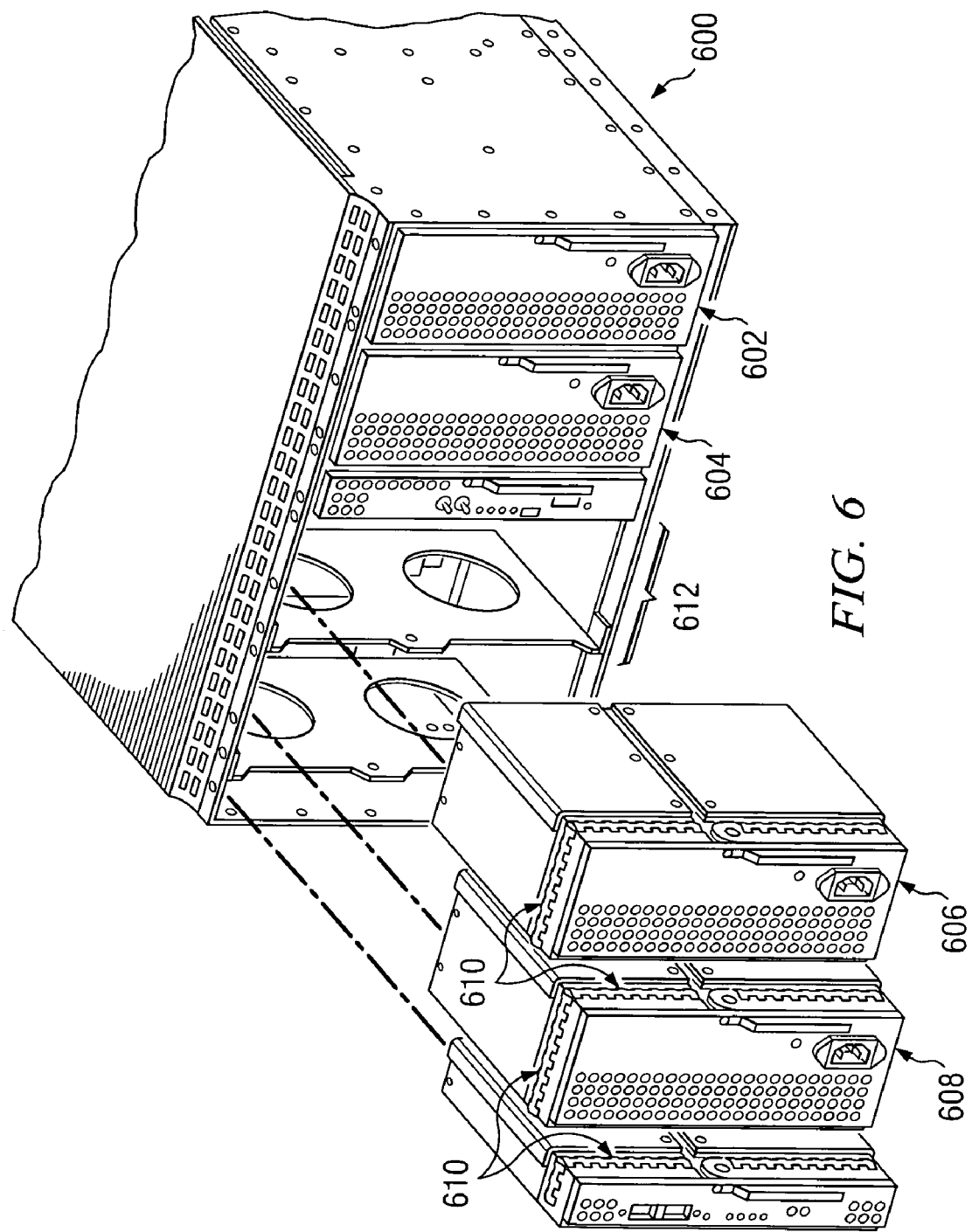
FIG. 6 depicts a pictorial diagram of an example application of EMI gaskets, described in FIGS. 2, 3, and 4, wherein the EMI gaskets are mounted to seal the gap between modules in the storage array.

Turning now to FIG. 6, a pictorial diagram of an example application of EMI gaskets, described in FIGS. 2, 3, and 4, is shown, wherein the EMI gaskets are mounted on the disk array modules to seal the gap between modules in the storage array. Storage array 600 is shown to have two disk modules 602 and 604 inserted into drive bays within storage array 600. Disk modules 606 and 608 are shown to have EMI gaskets 610, such as EMI gasket 400 shown in FIG. 4, installed on the modules. When disk module 606 is inserted into a drive bay, such as drive bay 612, the EMI gaskets fill the gaps between the modules, thereby providing an electrical connection to create an isolating electromagnetic cage around the radiating components within storage array 600. Consequently, the EMI gaskets reduce EMI problems by reducing air gaps or gaps of high resistance which provide pathways for electromagnetic leakage.

It should also be noted that the present invention may be used in any number of devices, and is not limited to the devices described above. The present invention may be utilized to provide EMI shielding for any type of device that produces electromagnetic interference and is capable of being implemented in a suitable module or chassis member.

Thus, the present invention provides an EMI suppression mechanism having a lead-in feature added to the rib or clip members of the EMI gasket. The mechanism of the present invention reduces the amount of force required of the assembler during the mounting process, thereby providing for easier assembly during rework or product upgrades. The present invention provides an advantage over known shielding gaskets by facilitating the installation process, wherein an assembler may use less force to insert a rib or clip into its respective slot. Consequently, the difficulty in mounting an EMI gasket in accordance with the present invention is reduced, as well as the damage to the gaskets from excess manipulation caused by the assemblers in their attempts to position the gaskets and applying pressure to force the ribs or clips into their slots. Physical problems of assembler thumbs and fingers may be reduced, as well as EMI failures caused by improperly mounted gaskets. The present invention may also reduce the corrosive effects caused by excess handling of the gasket due to re-fitting. The corrosive effects may deteriorate the conductivity of the material/plating surface over time and lead to early failure of the gasket joints, as well as causing the gasket to fall out of compliance with applicable agency regulations. Thus, by reducing the amount of force required to install the EMI gasket, the present invention may increase productivity by decreasing assembly time, decrease rework of improperly assembled or damaged gaskets, reduce the corrosive effects caused by excess handling, and reduce health risks and subsequent insurance claims of assemblers during manufacturing.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for facilitating electromagnetic energy shielding, the method comprising:

positioning an electromagnetic interference gasket over a receiving device, wherein the receiving device includes slots for receiving the electromagnetic interference gasket; wherein the electromagnetic interference gasket includes a metal shielding component comprising a longitudinal metal plate and a plurality of first ribs and a number of second ribs corresponding to and opposing the plurality of first ribs;

wherein the plurality of first ribs and second ribs extend beyond opposite side surfaces of the metal shielding component, are symmetric about the metal shielding component, and curve back inward under themselves; and wherein the plurality of second ribs further include an extended lip curving back outward underneath themselves; and inserting the ribs of the electromagnetic interference gasket into the slots of the receiving device, wherein the extended lip facilitates the insertion of the electromagnetic interference gasket into the slots of the receiving device.

2. The method of claim 1, wherein the plurality of first and second ribs of the electromagnetic interference gasket include an extended lip.

3. The method of claim 1, wherein the receiving device is one of a chassis member and a module.

4. The method of claim 1, wherein the receiving device is comprised of a steel, stainless steel, aluminum, or metal-coated polymer.

5. The method of claim 1, wherein the metal shielding component is comprised of thin beryllium copper, phosphor bronze, brass, or stainless steel.

6. The method of claim 1, wherein the metal shielding component includes a coating of tin, tin and lead, cadmium, or zinc.

7. A storage array for shielding electromagnetic energy, comprising:

a frame;

at least one drive bay mounted within the frame;

at least one storage array module inserted into the at least one drive bay;

at least one electromagnetic interference gasket mounted onto the at least one disk array module;

wherein the at least one electromagnetic interference gasket includes a metal shielding component comprising a longitudinal metal plate and a plurality of first ribs and a number of second ribs corresponding to and opposing the plurality of first ribs;

wherein the plurality of first ribs and second ribs extend beyond opposite side surfaces of the metal shielding component, are symmetric about the metal shielding component, and curve back inward under themselves; and wherein the plurality of second ribs further include an extended lip curving back outward underneath themselves, the extended lip facilitating the mounting of the at least one electromagnetic interference gasket onto the at least one storage array module.

8. The storage array of claim 7, wherein the plurality of first and second ribs of the electromagnetic interference gasket include an extended lip.

9. The storage array of claim 7, wherein the metal shielding component is comprised of thin beryllium copper, phosphor bronze, brass, or stainless steel.

10. The storage array of claim 7, wherein the metal shielding component includes a coating of tin, tin and lead, cadmium, or zinc.

* * * * *